(12) United States Patent
Zhang et al.

(10) Patent No.: US 9,116,176 B2
(45) Date of Patent: Aug. 25, 2015

(54) OPTICAL CURRENT TRANSFORMER FOR GAS-INSULATED APPARATUS

(75) Inventors: Wei Zhang, Hitachi (JP); Masashi Kawamata, Hitachi (JP); Hiroyuki Nakamichi, Hitachi (JP); Tatsushi Yamaguchi, Saitama (JP); Daigorou Shiozawa, Kitakatushika (JP)

(73) Assignee: Hitachi, Ltd., Tokyo (JP)

( * ) Notice: Subject to any disclaimer, the term of this patent is extended or adjusted under 35 U.S.C. 154(b) by 263 days.

(21) Appl. No.: 13/697,100

(22) PCT Filed: May 12, 2011

(86) PCT No.: PCT/JP2011/061470
§ 371 (c)(1),
(2), (4) Date: Dec. 20, 2012

(87) PCT Pub. No.: WO2011/142483
PCT Pub. Date: Nov. 17, 2011

(65) Prior Publication Data
US 2013/0093409 A1    Apr. 18, 2013

(30) Foreign Application Priority Data
May 13, 2010    (JP) ................................ 2010-111243

(51) Int. Cl.
G01R 31/00 (2006.01)
G01R 19/00 (2006.01)
G01R 15/24 (2006.01)
H02B 13/035 (2006.01)

(52) U.S. Cl.
CPC .............. G01R 19/00 (2013.01); G01R 15/246 (2013.01); H02B 13/0356 (2013.01)

(58) Field of Classification Search
None
See application file for complete search history.

(56) References Cited

U.S. PATENT DOCUMENTS

| 5,295,207 | A  * | 3/1994  | Dupraz et al. | 385/12  |
| 8,253,945 | B2 * | 8/2012  | Gahan et al.  | 356/480 |
| 2008/0303510 | A1 * | 12/2008 | Blake et al.  | 324/96  |

FOREIGN PATENT DOCUMENTS

| JP | 2-12669 U     |   | 1/1990 |
| JP | 02128165 A    | * | 5/1990 |
| JP | 04127068 A    | * | 4/1992 |
| JP | 05-232145 A   |   | 9/1993 |
| JP | 07-16171 U    |   | 3/1995 |

(Continued)

OTHER PUBLICATIONS

Korean Office Action concerning Japanese Application No. 2011-111243 dated Oct. 11, 2013, 2012-7029490 (five pages).

(Continued)

*Primary Examiner* — Paresh Patel
(74) *Attorney, Agent, or Firm* — Mattingly & Malur, PC

(57) ABSTRACT

At least one conductor is disposed in sealed vessel, which is filled with insulating gas, an hand hole is provided to a part of sealed vessel and is closed by a sealed cover, and optical fibers are disposed that form a closed loop surrounding conductor in sealed vessel. Optical fibers are hermetically led out of sealed vessel from sealed cover and are provided with at least a light source unit and an optical signal processor unit at the lead-out end. An airtight hollow tube disposed looping around leaving a predefined distance of separation is provided to conductor in sealed vessel, the end of tube is hermetically connected to sealed cover by sealing/bonding means, and optical fibers can be inserted in sealing/bonding means.

8 Claims, 3 Drawing Sheets

(56) References Cited

FOREIGN PATENT DOCUMENTS

| | | |
|---|---|---|
| JP | 08-211232 A | 8/1996 |
| JP | 10-142265 A | 5/1998 |
| JP | 2001-153896 A | 6/2001 |

OTHER PUBLICATIONS

International Preliminary Report on Patentability received in International Application No. PCT/JP2011/061470 dated Nov. 22, 2012 and Dec. 20, 2012.

* cited by examiner

OPTICAL CURRENT TRANSFORMER FOR GAS-INSULATED APPARATUS

TECHNICAL FIELD

The present invention relates to an optical current transformer for a gas-insulated apparatus particularly to such an optical current transformer for a gas-insulated apparatus as eases the task of disposing optical fibers that form a closed loop surrounding a conductor of the apparatus.

BACKGROUND ART

In a gas-insulated apparatus such as a gas-insulated switch gear or a gas-insulated main bus, at least one conductor is arranged inside a sealed vessel, which is filled with insulating gas having good insulation properties and put into a practical use. To measure the current flowing through the conductor inside the sealed vessel, a wound-type current transformer or an optical current transformer is usually used.

In the optical current transformer for a gas insulating apparatus described in Japanese Patent Application Laid-Open No. Hei 10-142265 (Patent literature 1) for example, an optical fiber, which is used as a current sensor, is annularly wound on each of three conductors arranged inside a sealed tank, and both ends of each optical fiber are led out of the sealed tank. With this configuration linear-polarized light emitted from a light-emission unit enters the optical fiber and outgoes therefrom with its polarization rotated because of Faraday effect of optical fiber. The angle of such polarization is detected with a measuring unit that functions as an optical current transformer for a gas insulating apparatus to determine the current flowing through.

In this style of optical transformer for a gas-insulate apparatus, airtightness at the leading-out portion should be assured in leading out the optical fiber from the sealed tank to prevent leakage of insulating gas. For this purpose, Japanese Patent Application Laid-Open No. Hei 8-211232 (Patent literature 2) for example has proposed providing a hermetic junction at the optical fiber leading-out portion on the sealed tank.

The hermetic junction described in Patent literature 2 being named an air tight adapter is used under the situation in which a cylindrical hollow flange is formed on the outer face of the sealed vessel in a protruding manner and a lid plate having a through-hole in the center thereof is detachably fixed on the cylindrical hollow flange. The air tight adapter has: a disc-like flange part placed so that the through-hole on the lid plate will be closed thereby, in which the disklike flange part is bored with an insertion hole to permit inserting an optical fiber; and an optical fiber, partly having metallic film thereon, inserted into the insertion hole, in which the space between the insertion hole and the metallic film is sealed and fixed with a material like solder.

In the case that an optical current transformer for gas insulated apparatus is composed using the air tight adapter defined in Patent literature 2, if the optical fiber requires replacement due to aging deterioration or similar reason, the replacement operation needs to remove the lid plate from the cylindrical hollow flange on the sealed vessel. In this operation, there is a problem in that the insulation gas in the sealed vessel must be treated first and thereafter the replacement of the optical fiber becomes practicable.

Further, the use of the air tight adapter of Patent literature 2 as a hermetic junction demands to change the number of the air tight adapters to a change-matched number when the protection system is required to be changed from a single system to a dual system or when the number of optical fibers is to be varied because of a requirement for increasing the optical current transformer, because such air tight adapter can fix is only one optical fiber. Moreover, dimensions of the cylindrical hollow flange, which is formed on the outer face of the sealed vessel in a protruding manner, or of the lid plate is to be varied depending on the size of the disc-like flange part having the insertion hole. Therefore, there has involved a problem in the use of such device in that, in an extreme case, the main circuit of the gas insulated apparatus has to be disassembled to permit replacing the sealed vessel.

An object of the present invention is to provide an optical current transformer for gas-insulated apparatus that permits, with a simple structure, disposing an optical fiber without emitting insulating gas in a sealed vessel and further permits an eased operation for increasing/decreasing the number of optical fibers.

DISCLOSURE OF INVENTION

The optical current transformer for gas-insulated apparatus by the present invention has: a sealed vessel filled with insulating gas; at least one conductor being arranged inside the sealed vessel, at least one hand hole being formed on a part of the sealed vessel; a sealed cover being placed on the each hand hole so as to close it; an optical fiber surrounding the conductor so as to form a closed loop, the optical fiber being hermetically led out to the outside of the sealed vessel through the sealed cover; at least a light source and an optical signal processor being provided on the lead out end of the optical fiber; an airtight hollow tube being disposed looping around the conductor in the sealed vessel with a predefined separation distance; and a sealing/bonding means hermetically fixing between the end of the airtight hollow tube and the sealed cover, and the airtight hollow has a configuration that the optical fiber can be inserted therethrough.

It is a preferable configuration that the inner diameter of the airtight hollow tube is two or more times the external diameter of the optical fiber and at least two optical fibers are inserted in the airtight hollow tube.

Moreover, it is a preferable configuration that the airtight hollow tube is a metallic hollow tube, both ends of the metallic hollow tube are fixed with a sealing/bonding means, the a sealing/bonding means includes a connecting plate having an insert hole thereon and an fixing member that hermetically fixes the metallic hollow tube with the connecting plate.

Further, it is a preferable configuration that the airtight hollow tube is an insulated hollow tube, both ends of the insulated hollow tube are fixed with a sealing/bonding means, the sealing/bonding means includes a connecting plate having an insert hole thereon, a joint fixed hermetically on the connecting plate, and a connecting member that detachably and hermetically fixes the end of the insulated hollow tube to the joint.

Furthermore, it is a preferable configuration that the airtight hollow tube of each phase is structured separately by embedding into a resin molding body.

Besides, the optical current transformer for gas-insulated apparatus by the present invention has: a sealed vessel filled with insulating gas; conductors for three-phase being arranged inside the sealed vessel, an hand hole being formed on a part of the sealed vessel, the hand hole being formed at only one location on the outer periphery of said sealed vessel; a sealed cover being placed on the each hand hole so as to close it; an optical fiber surrounding the conductor so as to form a closed loop, the optical fiber being hermetically led out to the outside of the sealed vessel through the sealed cover; at least a light source and an optical signal processor being provided on the lead out end of the optical fiber; an airtight hollow tube being disposed looping around the each conductors in the sealed vessel with a predefined separation distance; and a sealing/bonding means hermetically fixing between the end of the airtight hollow tube and the sealed cover, the end of the airtight hollow being routed to the hand hole side, and the airtight hollow has a configuration that the optical fiber can be inserted therethrough.

Further, it is a preferable configuration that the airtight hollow tubes of each phase are structured by embedding integrally into a resin molding body.

EFFECTS OF INVENTION

In a configuration of an optical current transformer for gas-insulated apparatus structured according to the present invention, an airtight hollow tube is disposed looping around the conductor in a sealed vessel with a predefined separation distance and the end of the airtight hollow tube is hermetically fixed on a sealed cover with a sealing/bonding means in such a manner that an optical fiber can be inserted into inside the airtight hollow tube. Therefore, an airtight construction can be actualized by a simple composition using an airtight hollow tube and a sealing/bonding means. Thus, an optical fiber replacement operation or changing the number of optical fibers by insertion of the same into the airtight hollow tube can be performed easily, without emitting insulating gas in the sealed vessel.

Further in an invented configuration, an hand hole is formed only one location on the outer periphery of a sealed vessel, an airtight hollow tube is disposed looping around each conductor in a sealed vessel with a predefined separation distance, and the end of each airtight hollow tube is routed in such a manner that all the tube ends gather at one location on the hand hole side and are hermetically fixed on a sealed cover with a sealing/bonding means. This configuration permits all the airtight hollow tube in the sealed vessel to be arranged and fixed in one position. Thereby, inserting the optical fiber into each of the airtight hollow tubes can be performed easily and the maintenance checkup of the optical current transformer becomes a very easy operation. Moreover, where the configuration employs such a construction that the airtight hollow tubes are integrally embedded into a resin molding body, the tubes come to be fixed hermetically on the sealed cover. This means that securing the tubes in the sealed vessel is easy; accordingly such construction offers an advantage in that installation of the airtight hollow tube can be performed more easily.

BRIEF DESCRIPTION OF INVENTION

BEST MODE FOR IMPLEMENTING THE INVENTION

The optical current transformer for gas-insulated apparatus by the present invention is has: a sealed vessel filled with insulating gas; at least one conductor being arranged inside the sealed vessel, at least one hand hole being formed on a part of the sealed vessel; a sealed cover being placed on the each hand hole so as to close it; an optical fiber surrounding the conductor so as to form a closed loop, the optical fiber being hermetically led out to the outside of the sealed vessel through the sealed cover; at least a light source and an optical signal processor being provided on the lead out end of the optical fiber. And, an airtight hollow tube being disposed looping around the conductor in the sealed vessel with a predefined separation distance; and a sealing/bonding means hermetically fixing between the end of the airtight hollow tube and the sealed cover, and the airtight hollow has a configuration that the optical fiber can be inserted therethrough.

Embodiment 1

The following details the optical current transformer for gas-insulated apparatus by the present invention referring to FIG. 1 to FIG. 4. Inside a sealed vessel 10, which is applied to a gas-insulated switch gear or a gas-insulated main bus, conductors 13 for three phases are accommodated collectively in an integrated three-phase configuration. The sealed vessel 10 is filled with insulating gas, the internal pressure of which is maintained at a predefined level. The sealed vessel 10 has, in the embodiment illustrated in FIG. 1, hand holes 11 at three locations on the outer periphery thereof. These hand holes 11 are closed by sealed covers 12 that are fixed using fastening means like bolts.

Figure 1:
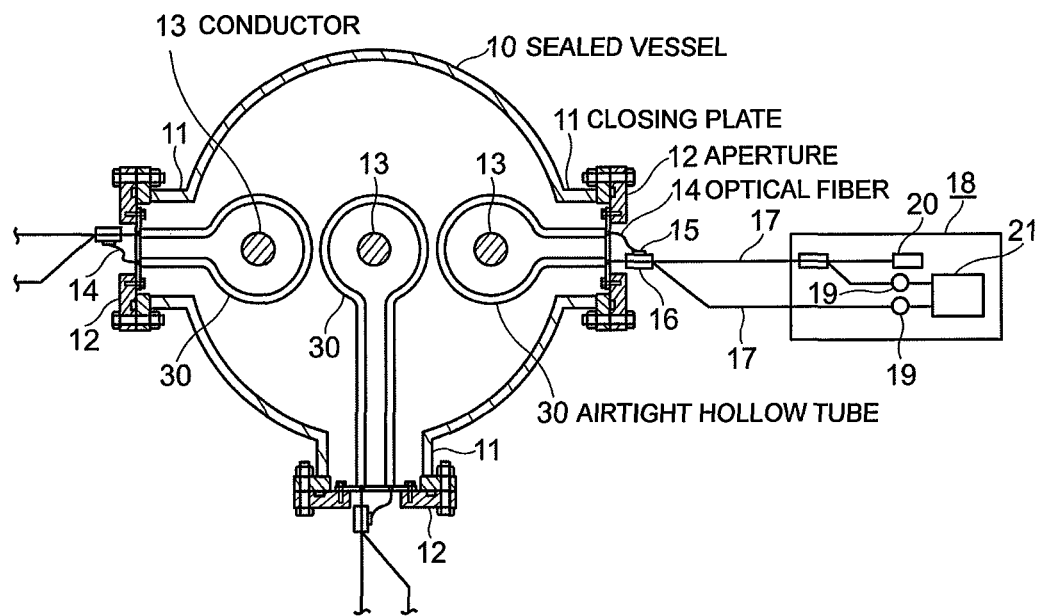
FIG. 1 is a schematic vertical cross-sectional view to illustrate an embodiment of the optical current transformer for gas-insulated apparatus by the present invention.

Surrounding each conductor 13, an optical fiber 14 is arranged so as to form a closed loop that works as a current sensor of a current transformer. The end of the optical fiber 14 is led out to the outside through the hand hole 11. Since FIG. 1 illustrates a reflector type current transformer, a reflector 15 is installed on one end of the led out optical fiber and an optical device 16 on the other end. Via a transmission optical fiber, the optical device 16 connects to an electronic circuitry 18, a commonly known device, which measures current flowing through each conductor 13.

Where the optical fiber 14 is used in a transmission type current transformer, one end of the optical fiber 14 leads to a light source, as known well, and the other end to the electronic circuitry 18.

As commonly known, a general electronic circuit for optical current transformer is used for the electronic circuitry 18. A typical configuration of such general circuit has, for example, two light receiving elements 19 composed of photodiodes, a light source 20 composed of such as a semiconductor laser or a super-luminescent diode, and a signal processing device 21 connected to the light receiving element 19.

To permit the optical fiber 14 being inserted with airtightness of the sealed vessel 10 maintained, an airtight hollow tube 30 is disposed looping around each of the conductors 13 with a predefined separation distance. The both ends of the airtight hollow tube 30 are arranged so that they extend to the hand hole 11 side and are hermetically fixed on the sealed cover 12 with a sealing/bonding means 31 in such a configuration that the optical fiber 14 can be inserted into inside the airtight hollow tube from the outside, which will be described later referring to FIG. 2 and FIG. 3.

Because of such configuration, the optical fiber 14 can be inserted with the airtightness of the sealed vessel 10 maintained when maintenance or replacement is required and such operation can be performed simply and efficiently since treatment of the insulating gas is not necessary when the hand hole 11, which is closed by the sealed cover 12, is opened.

The airtight hollow tube 30 stated above is formed so as to have an inner diameter being two or more times the external diameter of the optical fiber. This airtight hollow tube 30 is capable of being used with at least two optical fibers inserted therein. Therefore, in the case where the protection system is required to be changed from a single system to a dual system or where the number of optical fibers is to be varied because of a requirement for increasing or reducing the number of the optical current transformers, the required operation can be easily performed without changing dimensions of the hand hole 11 or other related portions. For example, when two optical fibers are to be inserted, it is practicable to assign one optical fiber to the optical current transformer for each phase and to assign the other optical fiber, with being connected in series, to a zero-phase current transformer for measuring the zero-phase current.

Figure 2:
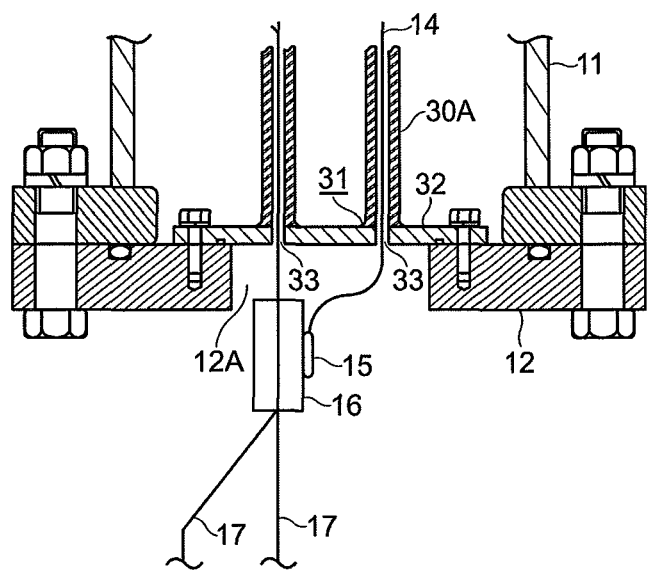
FIG. 2 is an enlarged schematic vertical cross-sectional view to illustrate an embodiment of a main part of the airtight hollow tube and the sealing/bonding means indicated in FIG. 1.

As the airtight hollow tube 30, a metallic hollow tube 30A made of easy processing metallic material or an insulated hollow tube 30B is feasible in consideration for minimizing disturbance over the electrical field around the conductor 13 arranged inside the sealed vessel 10 and for avoiding increase in dimensions between each conductor 13 or in sizes of the sealed vessel 10. Such hollow tubes permit being fixed on the sealed cover 12 as will be explained later. Where the metallic hollow tube 30A is used as the airtight hollow tube 30, an insulating material should be, as a common practice, placed between the metallic hollow tube 30A and the conductor 13 to assure sufficient insulation between them.

Where the metallic hollow tube 30A is used as the airtight hollow tube 30, the sealed cover 12 is hermetically fixed using the sealing/bonding means 31 as illustrated in FIG. 2. As illustrated, the sealing/bonding means 31 includes a connecting plate 32 having an insert hole 33 thereon and an fixing portion, such as a weld, that hermetically fixes the end of the metallic hollow tube 30A to the insert hole 33 on the connecting plate 32. The connecting plate 32 is detachably installed on the sealed cover 12, which has an opening 12A, using a fixing member like a fixing bolt, sandwiching a seal ring such as an O-ring to permit maintaining airtightness.

Figure 3:
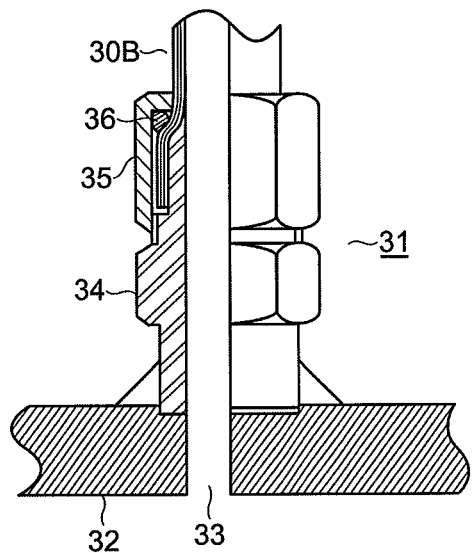
FIG. 3 is an enlarged schematic vertical cross-sectional view to illustrate another embodiment of a main part of the airtight hollow tube and the sealing/bonding means indicated in FIG. 1.

In the sealing/bonding means 31 illustrated in FIG. 2, the operation of inserting the optical fiber 14 inside the metallic hollow tube 30A is performed in a manner as follows. The optical fiber 14 is inserted into the metallic hollow tube 30A through one insert hole 33 provided on the connecting plate 32. The optical fiber 14 so inserted passes through the metallic hollow tube 30A forming a closed loop surrounding the conductor 13 and is lead out to the outside from the other insert hole 33.

Where the insulated hollow tube 30B is used as the airtight hollow tube 30, the sealed cover 12 is fixed hermetically using the sealing/bonding means 31 illustrated in FIG. 3. As illustrated, the bottom end of a joint 34 is fixed, with a method such as welding, on the inner face of the connecting plate 32 having the insert hole 33. The insulated hollow tube 30B is coupled to the free end of the joint 34 and fixed with a connecting member 35, which is a joining device like a flare nut and is screwed thereon.

In this configuration, a sealing member 36 made of steel is sandwiched between the insulated hollow tube 30B and the connecting member 35 to increase the bearing pressure between the insulated hollow tube 30B and the joint 34 so that the leakage of the insulating gas from the fixing portion of the insulated hollow tube 30B will be prevented. In the case of the sealing/bonding means 31 illustrated in FIG. 3 to be used for the insulated hollow tube 30B, the operation of inserting the optical fiber 14 inside the insulated hollow tube 30B can be performed in a similar manner as stated above.

In the optical current transformer by the present invention, the metallic hollow tube 30A or the insulated hollow tube 30B is used as the airtight hollow tube 30 and their ends are hermetically fixed on the sealed cover 12, which is to be fixed on the hand hole 11, with the sealing/bonding means 31. Therefore, installation of the optical fiber 14, which is to be arranged surrounding the conductor 13, inside the sealed vessel 10 can be very easily completed in a shorter time with the airtightness of the sealed vessel 10 maintained.

Figure 4:
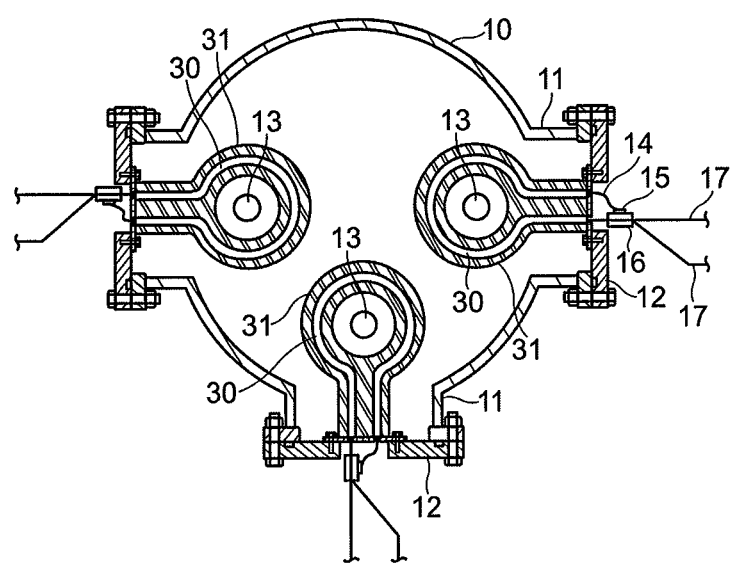
FIG. 4 is a schematic vertical cross-sectional view to illustrate a variation of the optical transformer for gas-insulated apparatus illustrated in FIG. 1.

In the case of the sealed vessel 10 of an integrated three-phase type in which conductors 13 for three phases are collectively arranged, as FIG. 4 illustrates, the airtight hollow tube 30 of each phase can be used in a form being embedded separately for each phase in a one-body of a resin molding body 31 by molding using such as epoxy resin.

As a matter of course, a hermetical fixing to the sealed cover 12 is established using the sealing/bonding means 31 illustrated in FIG. 2 or FIG. 3, or other suitable means according to the material used in the airtight hollow tube 30. It is practicable to loop around the conductor 13 with a predefined separation distance. It is also practicable to combine constituent parts such as the optical device 16 and the electronic circuitry 18 each with optical fiber 14 to form an optical current transformer similarly to the embodiment illustrated in FIG. 1.

The resin molding body 31 of each phase can be arranged in combination with each of the conductors 13 in the sealed vessel 10 and can be easily fixed hermetically on the sealed cover 12. Further, the optical fiber 14 can be easily inserted into each of the airtight hollow tubes 30 as stated above. Therefore, regardless of which tube, the metallic hollow tube 30A or the insulated hollow tube 30B, is used as the airtight hollow tube 30 to be embedded in the resin molding body 31, a construction with an assured insulation distance between the conductor 13 can be achieved.

Embodiment 2

Figure 5:
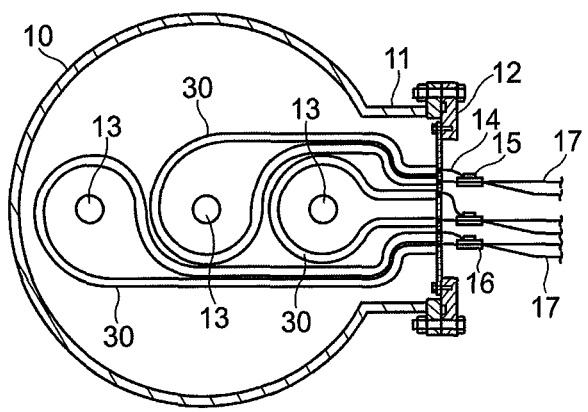
FIG. 5 is a schematic vertical cross-sectional view to illustrate another embodiment of the optical current transformer for gas-insulated apparatus by the present invention.

The optical current transformer for gas-insulated apparatus illustrated in FIG. 5 as another embodiment of the present invention has a construction, in which an hand hole 11 is formed singly at only one location on the outer periphery of a sealed vessel 10 and the hand hole 11 is closed by a sealed cover 12. Airtight hollow tubes 30, each of which correspondingly loops around a conductor 13 of each phase with a predefined separation distance, is routed so that both ends of them will extend to the hand hole 11 side provided at such single location. Their ends are fixed commonly on the sealed cover 12 in the same hermetical manner as stated above and an optical fiber 14 is inserted into each of the airtight hollow tubes 30.

With this configuration, one hand hole 11 on the sealed vessel 10 is enough. Therefore, the airtight hollow tube 30 for each phase can be disposed concentratedly at one location and the arranging operation of the airtight hollow tube 30 will be expedited efficiently. Further, the reduced number of the hand holes 11 on the sealed vessel 10 makes the sealing with the sealed cover 12 more assured.

In the embodiment illustrated in FIG. 5, ends of the airtight hollow tubes 30 positioned in the left and in the center of the illustration are disposed dispersedly on the lower side and on the upper side to ease arranging in the sealed vessel 10 and fixing on the sealed cover 12 so that all the ends will be adequately routed as a whole. However, both ends of the airtight hollow tube 30 may be routed to the same side for example.

Figure 6:
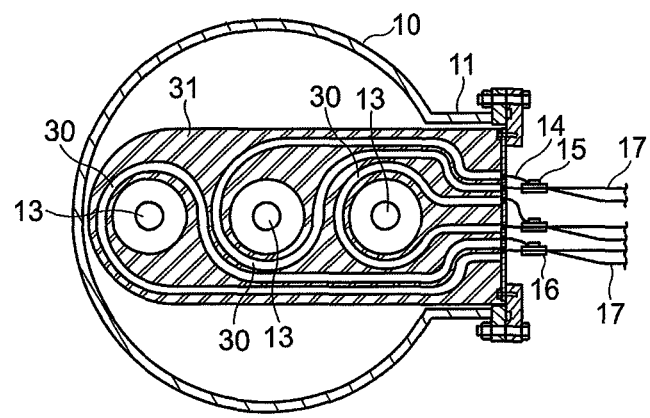
FIG. 6 is a schematic vertical cross-sectional view of a variation of the optical current transformer for gas-insulated apparatus illustrated in FIG. 5.

The airtight hollow tube 30 for each phase may be configured in a manner: molding the tubes for three phases collectively in a resin molding body 31 as illustrated in FIG. 6, arranging such mold in the sealed vessel 10 through the single hand hole 11, and combining them with the conductor 13 of each phase. In this integrated three-phase type of the resin molding body 31, the resin molding body 31 arranged in the sealed vessel 10 can be taken out more easily where hermetical fixing to the sealed cover 12 is employed.

The resin molding body 31 of one-body-molded type may be used devising the way of supporting the free end thereof in the sealed vessel 10. For example, the resin molding body 31 can be used in a state being engaged on a supporting seat provided on the inner face of the sealed vessel 10 in which the supporting seat has such a construction given by such devising as causes no disturbance over the insulation performance. In this configuration, the fixing of the resin molding body 31 on the sealed cover 12 side can be made mechanically more strong.

Each of the embodiments of the optical current transformer for gas-insulated apparatus by the present invention has been explained taking a gas-insulated apparatus of an integrated three-phase type as the explanation embodiment. The invention however is able to achieve the same effect in the case of applying to an apparatus of a single-phase type and it is obvious that embodying the sealing/bonding means 31 in various other structures are practicable. Although embodiments in FIG. 2 and FIG. 3 use a connecting plate 32 having an insert hole 33 thereon, use of the sealed cover 12 instead is also feasible by making the insert hole thereon.

Embodiments illustrated in FIG. 4 and FIG. 6 have been explained based on such a structure that only the airtight hollow tube 30 of each phase is embedded in the resin molding body 31. It is also feasible to employ another configuration in which a conductor that will form a part of the conductor 13 is separately provided, such conductor is molded together with the conductor 13 and the airtight hollow tube 30, such mold is arranged inside the sealed vessel 10, and then the conductor embedded in the resin molding body 31 and the conductor 13 are electrically connected.

INDUSTRIAL APPLICABILITY

Because the optical transformer for gas-insulated apparatus by the present invention is applicable not only to a gas-insulated apparatus of integrated three-phase type but also to a gas-insulated apparatus of single-phase type, the invention is suitable for application to a wide range of gas-insulated apparatuses.

The invention claimed is:

1. An optical current transformer for a gas-insulated apparatus comprising:
   a sealed vessel filled with insulating gas;
   at least one conductor being arranged inside the sealed vessel, at least one hand hole being formed on a part of the sealed vessel;
   a sealed cover being placed on each hand hole so as to close the respective hand hole;
   an optical fiber surrounding the conductor so as to form a closed loop, the optical fiber being hermetically led out to the outside of the sealed vessel through the sealed cover;
   at least a light source and an optical signal processor being provided on the optical fiber outside of the sealed vessel;
   an airtight hollow tube disposed to loop around the conductor in the sealed vessel with a predefined separation distance; and
   sealing/bonding means to hermetically fix the end of the airtight hollow tube and the sealed cover,
   wherein the airtight hollow tube has a configuration such that the optical fiber can be inserted therethrough,
   wherein the airtight hollow tube is an insulated hollow tube, and both ends of the insulated hollow tube are fixed with the sealing/bonding means, and
   wherein the sealing/bonding means includes a connecting plate having an insert hole thereon, a joint fixed hermetically on the connecting plate, and a connecting member that detachably and hermetically fixes the end of the insulated hollow tube to the joint.

2. The optical current transformer according to claim 1, wherein an inner diameter of the airtight hollow tube is two or more times an external diameter of the optical fiber and at least two optical fibers are inserted in the airtight hollow tube.

3. The optical current transformer according to claim 1, wherein the airtight hollow tube is a metallic hollow tube, both ends of the metallic hollow tube are fixed with the sealing/bonding means, and the sealing/bonding means includes a connecting plate having an insert hole thereon and an fixing member that hermetically fixes the metallic hollow tube with the connecting plate.

4. The optical current transformer according to claim 1, wherein the airtight hollow tube is separately embedded into a resin molding body.

5. An optical current transformer for a gas-insulated apparatus comprising:
   a sealed vessel filled with insulating gas;
   conductors for three-phases being arranged inside the sealed vessel, a hand hole being formed on a part of the sealed vessel, the hand hole being formed at only one location on the outer periphery of said sealed vessel;
   a sealed cover being placed on each hand hole so as to close the respective hand hole;
   optical fibers respectively surrounding each of the conductors so as to form a closed loop, the optical fiber being hermetically led out to the outside of the sealed vessel through the sealed cover;
   at least a light source and an optical signal processor being provided on the optical fibers outside of the sealed vessel;
   airtight hollow tubes respectively disposed to loop around each of the conductors in the sealed vessel with a predefined separation distance; and
   sealing/bonding means to hermetically fix respective ends of the airtight hollow tubes and the sealed cover,
   wherein the ends of the airtight hollow tubes are routed to the hand hole side, and the airtight hollow tubes have a configuration such that the optical fibers can be inserted therethrough, wherein the airtight hollow tube is an insulated hollow tube, and both ends of the insulated hollow tube are fixed with the sealing/bonding means, and wherein the sealing/bonding means includes a connecting plate having an insert hole thereon, a joint fixed hermetically on the connecting plate, and a connecting member that detachably and hermetically fixes the end of the insulated hollow tube to the joint.

6. The optical current transformer according to claim 5, wherein the airtight hollow tubes of each phase of the conductors are embedded integrally into a resin molding body.

7. The optical current transformer according to claim 5, wherein the airtight hollow tube is a metallic hollow tube, both ends of the metallic hollow tube are fixed with the sealing/bonding means, and the sealing/bonding means includes a connecting plate having an insert hole thereon and an fixing member that hermetically fixes the metallic hollow tube with the connecting plate.

8. The optical current transformer according to claim 5, wherein each of the airtight hollow tubes for each of the three phases is separately embedded into a resin molding body.

* * * * *